(12) United States Patent
Austin et al.

(10) Patent No.: US 6,769,893 B2
(45) Date of Patent: Aug. 3, 2004

(54) APPARATUS FOR VACUUM ENCAPSULATION OF SEMICONDUCTOR CHIP PACKAGES

(75) Inventors: Eric Austin, Carlsbad, CA (US); Steve Majgier, San Jose, CA (US); David Padgett, Carlsbad, CA (US); Kyle Springer, Carlsbad, CA (US)

(73) Assignee: Nordson Corporation, Westlake, OH (US)

( * ) Notice: Subject to any disclaimer, the term of this patent is extended or adjusted under 35 U.S.C. 154(b) by 357 days.

(21) Appl. No.: 09/898,601

(22) Filed: Jul. 3, 2001

(65) Prior Publication Data

US 2001/0040306 A1 Nov. 15, 2001

Related U.S. Application Data

(62) Division of application No. 09/322,416, filed on May 28, 1999, now Pat. No. 6,284,173, which is a continuation of application No. 09/187,617, filed on Nov. 6, 1998, now abandoned.

(51) Int. Cl.⁷ ........................... B29C 31/00; B29C 70/72
(52) U.S. Cl. ................................................. 425/110
(58) Field of Search ................................. 425/110, 449

(56) References Cited

U.S. PATENT DOCUMENTS

| | | | |
|---|---|---|---|
| 4,049,244 A | 9/1977 | Hedrich | 259/185 |
| 4,279,360 A | 7/1981 | Häuser | 222/1 |
| 5,147,660 A | 9/1992 | Steindorf | 425/546 |
| 5,203,076 A | * 4/1993 | Banerji et al. | 29/840 |
| 5,382,394 A | 1/1995 | Terhardt | 425/546 |
| 5,409,523 A | 4/1995 | Haeuser | 95/260 |
| 5,435,953 A | 7/1995 | Osada et al. | 264/102 |
| 5,529,212 A | 6/1996 | Terhardt | 222/1 |
| 5,591,252 A | 1/1997 | Haeuser | 95/260 |
| 5,659,952 A | 8/1997 | Kovac et al. | 29/840 |
| 5,670,203 A | 9/1997 | Terhardt et al. | 427/58 |
| 5,834,339 A | * 11/1998 | Distefano et al. | 438/125 |
| 5,866,442 A | * 2/1999 | Brand | 438/108 |
| 5,998,242 A | * 12/1999 | Kirkpatrick et al. | 438/127 |
| 6,046,076 A | * 4/2000 | Mitchell et al. | 438/127 |
| 6,119,895 A | * 9/2000 | Fugere et al. | 222/1 |
| 6,238,948 B1 | * 5/2001 | Ramalingam | 438/106 |
| 6,444,035 B1 | * 9/2002 | Nowak et al. | 425/110 |

FOREIGN PATENT DOCUMENTS

GB 2156247 A 10/1985

OTHER PUBLICATIONS

Chris Lawing, Camelot Systems, Inc., *Vacuum Dispensing Of Encapsulants For uBGA Manufacturing*, Electronic Packaging & Production, Feb. 1998 (pp. 87–91).

(List continued on next page.)

*Primary Examiner*—Robert B. Davis
(74) *Attorney, Agent, or Firm*—Wood, Herron & Evans, LLP

(57) ABSTRACT

A multi-chamber vacuum encapsulation system for encapsulation of semiconductor chip packages. The encapsulation system includes a dispense chamber, an inlet chamber mounted adjacent an inlet end of the dispense chamber, and an outlet chamber mounted adjacent an outlet end of the dispense chamber. The dispense chamber includes a material dispensing head for dispensing encapsulant material about the peripheral edges of chip packages under at least partial vacuum of the dispense chamber. A transport mechanism is provided in the dispense chamber for moving the chip packages between the inlet and outlet ends of the chamber. Methods of vacuum encapsulating semiconductor chip packages are also disclosed.

10 Claims, 3 Drawing Sheets

OTHER PUBLICATIONS

Mark J. Norris, *The Dispensing Process In Advanced Electronic Component Manufacturing Of Ball Grid Arrays, Flip Chip & Chip Scale Packages,* Pan Pacific Microelectronics Symposium, Feb. 10–13, 1998 (pp. 179–185).

*New CSP Dispensing Systems Offer Fast, Void–Free Encapsulation,* and Craig Mitchell, Tessera, Inc., *Recent Advances In CSP Encapsulation,* Chip Scale Review, Mar. 1998.

Chris Lawing, Camelot Systems Inc., *Preventing Voids In uBGA® Packages*, Chip Scale Review, Mar. 1998 (pp. 48–51).

Ron Iscoff, *Pushing The Envelope For the Next Generation of CSPs,* Chip Scale Review, Mar. 1998 (pp. 25–29).

Verfahrenstechnik Hübers GmbH, *Vacuum Casting Resin Plants,* Verfahrenstechnik Hübers GmbH Sales Brochure, date unknown (6 pages).

Wilhelm Hedrich Vacuumanlagen GmbH & Co. KG, *Vaccum Technology—Worldwide—For Tomorrow's Innovation,* Wilhelm Hedrich Vacuumanlagen Sales Brochure, date unknown (6 pages).

Wilhelm Hedrich Vacuumanlagen GmbH & Co. KG, *Hedrich "On–The–Fly" Degassi,* Wilhelm Hedrich Vacuumanlagen Sales Brochure, date unknown (2 pages).

Wilhelm Hedrich Vacuumanlagen GmbH & Co. KG, *Vacuum Shot Dosing Equipment,* Wilhelm Hedrich Vacuumanlagen Sales Brochure, date unknown (pp. 1–40).

\* cited by examiner

APPARATUS FOR VACUUM ENCAPSULATION OF SEMICONDUCTOR CHIP PACKAGES

The present application is a divisional of U.S. Ser. No. 09/322,416, filed May 28, 1999 and now U.S. Pat. No. 6,284,173, which is a continuation of U.S. Ser. No. 09/187,617, filed Nov. 6, 1998 and now abandoned, the disclosures of which are hereby incorporated herein by reference in their entirety.

FIELD OF THE INVENTION

The present invention relates generally to dispensing systems for dispensing material onto substrates and, more particularly, to a material dispensing system and method for encapsulating semiconductor chip packages under vacuum.

BACKGROUND OF THE INVENTION

Manufacturers of semiconductor chip packages use encapsulation to protect the silicon die and delicate wire bonded leads of the devices from moisture, chemical attack and mechanical stresses. With recent advances in chip packaging technology, such as in microball gate array ("μBGA") chip packaging, the encapsulant material also serves as a compliant or resilient layer between the silicon die and the support substrate to accommodate for differences in the thermal coefficient of expansion of the die and support substrate.

In μBGA chip packaging, the silicon die is not bonded directly to the substrate as in other chip packaging schemes, but rather is supported above the substrate by compliant standoffs that create a small gap or void between the die and the support substrate. Wire bonded leads extend from the support substrate and are attached to contacts formed on the surface of the silicon die that faces the substrate. The encapsulant material is forced into the gap between the die and substrate to fill voids formed between the wire bonded leads and compliant standoffs, as well as to isolate the die surface and contacts from the outside environment. The encapsulant layer has sufficient resiliency to absorb the mechanical stresses created between the die and substrate that result from the mismatched thermal coefficients of expansion.

In the past, manufacturers of μBGA chip packages and other types of chip packages have used pressure encapsulation to create a void-free encapsulation layer between the die and substrate. In this technique, encapsulant material is dispensed onto the substrate about three peripheral edges of the die. Capillary action pulls the encapsulant material beneath the die into the gap. After some dwell time to allow the material to flow beneath the die, material is dispensed along the fourth edge of the die to create a trapped void beneath the die. The chip package is placed in a pressure oven and subjected to an increased pressure over atmosphere. The pressure differential created between the trapped void and the surrounding chamber collapses the void and forces encapsulant material to uniformly fill the gap between the die and support substrate.

Recently, vacuum encapsulation has been developed to form void-free encapsulation layers in μBGAs and other chip packages. Examples of vacuum encapsulation systems and methods may be found in U.S. Pat. Nos. 5,659,952 and 5,203,076.

In any encapsulation dispensing process, several critical issues must be addressed, including the elimination of any voids or bubbles in the dispensed encapsulant layer, as well as the speed of the encapsulation process. Currently, there is still a need to improve the speed of the encapsulation process, especially for high-volume chip scale manufacturers.

SUMMARY OF THE INVENTION

The present invention overcomes the foregoing and other shortcomings and drawbacks of chip package encapsulation systems and methods heretofore known. While the invention will be described in connection with certain embodiments, it will be understood that the invention is not limited to these embodiments. On the contrary, the invention includes all alternatives, modifications and equivalents as may be included within the spirit and scope of the present invention.

In accordance with the principles of the present invention, a multi-chamber vacuum encapsulation system is contemplated having a dispense chamber, an inlet chamber mounted adjacent an inlet end of the dispense chamber, and an outlet chamber mounted adjacent an outlet end of the dispense chamber. The inlet and outlet chambers are advantageously smaller in volume than the dispense chamber.

Movable partitions or doors are mounted between the inlet and outlet ends of the dispense chamber and the inlet and outlet chambers. When the doors are closed, a substantially air-tight seal is formed between the dispense chamber and the inlet and outlet chambers.

During the encapsulation process, the dispense chamber remains evacuated at all times while the smaller inlet and outlet chambers are evacuated and vented in a controlled manner to allow transfer of chip packages to and from the dispense chamber without venting of the dispense chamber to atmosphere.

The inlet chamber is vented to atmosphere before one or more semiconductor chip packages are moved into the inlet chamber. The inlet chamber is then evacuated before the semiconductor chip packages are transferred by a transport mechanism to the dispensing chamber through an opening formed by raising of the door between the inlet and dispense chambers. When the transfer of the semiconductor packages from the inlet chamber to the dispense chamber is complete, the door separating the inlet and outlet chambers is closed and the inlet chamber is vented to atmosphere to receive new semiconductor chip packages for encapsulation.

The dispense chamber includes a material dispenser mounted within the chamber for dispensing encapsulant about peripheral edges of a semiconductor chip package under at least partial vacuum of the dispense chamber during a dispense cycle. When the dispense cycle in the dispense chamber is complete, the semiconductor chip packages are transferred by a transport mechanism to the outlet chamber through an opening formed by raising of the door between the outlet and dispense chambers. Prior to the transfer, the outlet chamber is evacuated. When the transfer is complete, the door separating the dispense chamber from the outlet chamber is closed and the outlet chamber is vented to atmosphere at a controlled rate to force the encapsulant into the semiconductor chip package and form a substantially uniform, void-free encapsulant layer therein.

The inlet chamber serves as a pre-dispense part queuing station while the outlet chamber serves as a post-dispense dwell and vent station for the semiconductor chip packages carrying encapsulant material. In this way, the multi-chamber vacuum encapsulation system of the present invention distributes the various stages of the encapsulation process across multiple chambers to increase the speed of the encapsulation process. The smaller sizes of the inlet and outlet chambers relative to the size of the dispense chamber permits rapid evacuation and venting of the inlet and outlet chambers while allowing the dispense chamber to remain evacuated through the entire encapsulation process to further improve throughput.

The above and other objects and advantages of the present invention shall be made apparent from the accompanying drawings and the description thereof.

BRIEF DESCRIPTION OF THE DRAWINGS

Following is a brief description of the drawings in which.

DETAILED DESCRIPTION OF SPECIFIC EMBODIMENTS

Figure 1:
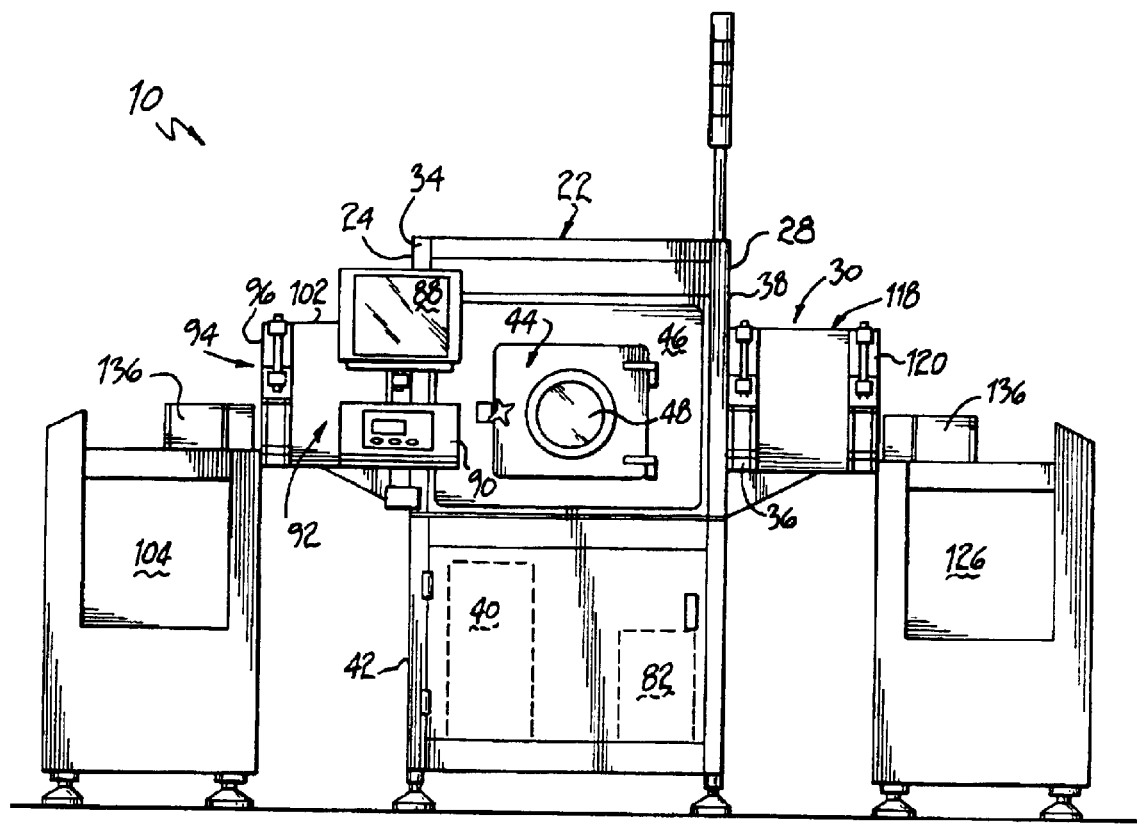
FIG. 1 is a front elevational view illustrating a multi-chamber vacuum encapsulation system in accordance with the principles of the present invention for encapsulation of semiconductor chip packages.

With reference to the figures, and to FIGS. 1–4 in particular, a multi-chamber vacuum encapsulation system 10 is shown in accordance with the principles of the present invention for encapsulating semiconductor chip packages 12. The semiconductor chip packages 12, shown in the figures as a strip 14 supported in a frame 16 (FIGS. 3 and 5) may be one of many types of chip packages, including flip chips, ball gate arrays (BGAs) or micro-ball gate arrays ("μBGAs"). For μBGAs, frame 16 may take the form of a Jedec tray or Auer boat for supporting the chip package strips 14 in a manner well known in the art. As will be described in greater detail below, the multi-chamber encapsulation system 10 is adapted to dispense encapsulating material about peripheral edges 18 of the chip packages 12 in a controlled pattern (FIG. 6) under at least partial vacuum, and then to vent the chip packages 12 to atmosphere to force encapsulation material to migrate into the chip packages 12 and form uniform, void-free encapsulation layers 20 (FIG. 6B) in the chip packages. While the multi-chamber vacuum encapsulation system 10 will be described in detail below with reference to encapsulation of μBGA chip package strips, those of ordinary skill in the art will readily appreciate the many applications to which the encapsulation system 10 is susceptible without departing from the spirit and scope of the present invention.

The multi-chamber encapsulation system 10 includes an enclosed dispense chamber 22 having an inlet end 24 and an outlet end 28. A vertically movable partition or door 32 is mounted adjacent the inlet end 24 to permit chip package strips 14 to be transferred into the dispense chamber 22 through an opening (not shown) formed in a wall 34 of the chamber 22. A vertically movable partition or door 36 is also mounted adjacent the outlet end 28 to permit chip package strips 14, onto which encapsulant material has been dispensed, to be transferred out of chamber 22 through an opening (not shown) formed in an opposite wall 38 of the chamber 22. A controller 40 (shown in phantom in FIG. 1) is supported in housing 42 of the vacuum encapsulation system 10 to control opening and closing of the doors 32 and 36 as described in greater detail below. A door 44 is hinged to a front wall 46 of the dispense chamber 22 to provide access into the interior of the dispense chamber 22 as may be required. A viewport 48 is mounted in the door 44 to permit observation of the encapsulation process performed within the dispense chamber 22. In one embodiment of the present invention, the dispense chamber 22 may have a volume of about eight (8) cubic feet, although other sizes are contemplated.

A transport mechanism 50, that may be in the form of a conveyor 52, is supported in a lower portion of the dispense chamber 22 for conveying the chip package strips 14 through the dispense chamber 22 between the inlet and outlet ends 24, 28. The transport mechanism 50 is operated through servo-controlled steppers 54 that are controlled by a controller 56. The conveyor 52 may include a pair of spaced O-ring belts 58 (one shown in FIG. 2) that pass around the steppers 54 that serve as endstocks of conveyor 52.

An encapsulant material dispenser 60 is supported in an upper portion of the dispense chamber 22 and is controlled by a controller 62. The material dispenser 60 includes an XYZ motion system (not shown) to provide precision position control of a dispensing needle 64 (FIG. 4) relative to each chip package strip 14 during the dispense cycles. The material dispenser 60 also includes a CCR vision system 66 that provides automatic pattern recognition to allow proper registration and movement of the material dispenser 60 relative to the chip package strip 14 before and during each dispense cycle. The material dispenser 60 may include a positive displacement pump (not shown) with an automatic tip height sensor for dispense needle 64, and a dispense service station (not shown) for priming and purging of dispense needle 64. A suitable material dispenser for use in dispense chamber 22 is the Model DP 2000 material dispenser commercially available from Asymtek of Carlsbad, Calif.

The dispense chamber 22 may include a dispense portion 68 (FIG. 2) and a dwell portion 70. The material dispenser 60 may be supported in the dispense portion 68 of the chamber 22 at which location the material dispenser 60 dispenses encapsulant material about the peripheral edges 18 of each chip package 12 under at least partial vacuum according to a desired dispensing pattern. The chip packages 12 onto which encapsulant material has been dispensed may be moved from the dispense portion 68 of chamber 22 to the dwell portion 70 at which location the chip packages 12 dwell for a predetermined period of time under at least partial vacuum to allow the encapsulant material to generally flow into each of the chip packages 12 as described in detail below.

A lift table 72 (FIGS. 1 and 4) is supported in the dispense portion 68 of the dispense chamber 22 for lifting and clamping the chip package strip 14 to a pair of spaced clamps 74 (FIG. 4) prior to a dispense cycle. The lift table 72 is driven in a vertical direction toward the material dispenser 60 by an arm 76 (FIG. 4) attached to a stepper motor (not shown). Lift table 72 includes registration pins 78 (FIG. 4) that extend through apertures 80 formed in the frame 16 and are received in apertures (not shown) formed in the respective clamps 74. The lift table 72 and clamps 74 are provided to rigidly support the chip package strips 14 relative to the material dispenser 60 during a dispense cycle.

A vacuum pump 82 is supported in the housing 42 (FIGS. 1 and 2) of the vacuum encapsulation system 10 and is fluidly connected to a block valve 84 associated with the dispense chamber 22 for providing and maintaining at least partial vacuum in the dispense chamber 22 while chip package strips 14 are encapsulated by material dispenser 60 and conveyed through the dispense chamber 22. The dispense chamber 22 also includes a vent valve 86 that permits venting of the dispense chamber 22 to atmosphere as may be required during the encapsulation process. When the doors 32 and 36 are each moved to a closed position, the dispense chamber 22 is hermetically sealed and may be evacuated by vacuum pump 82 to about 40 torr for the encapsulation process. With reference to FIG. 1, the vacuum encapsulation system 10 includes a monitor 88 and touch pad 90 to provide a user interface 92 to the system 10. The dispense chamber 22, and the associated material dispenser 60, lift table 72, conveyor 52, and vacuum pump 82, are commercially sold in pre-packaged form by Asymtek of Carlsbad, Calif. as Asymtek's Model C-718-VE Vacuum Encapsulation System.

Figure 2:
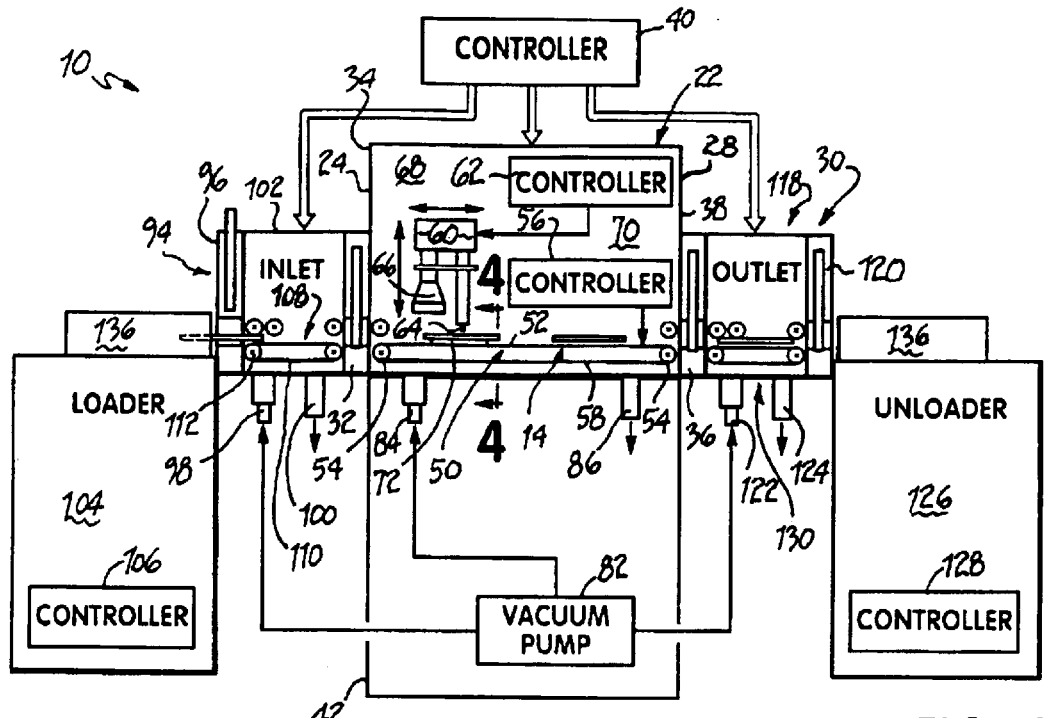
FIG. 2 is a functional block diagram of the multi-chamber encapsulation system shown in FIG. 1.
Figure 3:
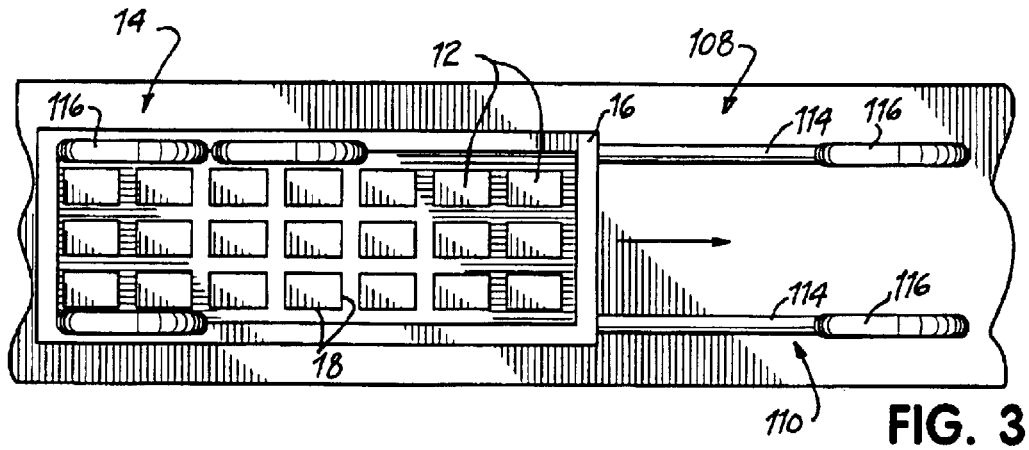
FIG. 3 is a partial plan view illustrating a transport mechanism for moving a strip of semiconductor chip packages through one of the chambers of the multi-chamber vacuum encapsulation system shown in FIG. 1.
Figure 4:
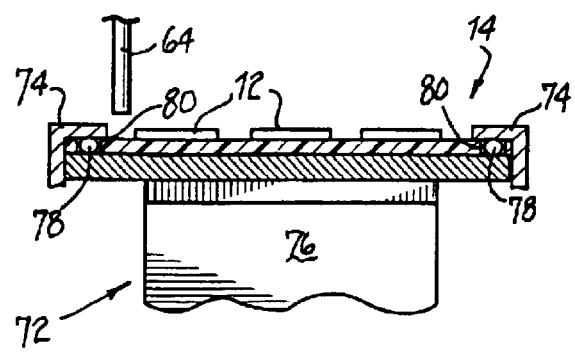
FIG. 4 is a cross-sectional view taken along line 4—4 of FIG. 2.

With further reference to FIGS. 1 and 2, multi-chamber vacuum encapsulation system 10 includes an enclosed inlet chamber 94 that is smaller in volume than dispense chamber 22. Inlet chamber 94 is mounted adjacent the inlet end 24 of dispense chamber 22 and includes a vertically movable door or partition 96 mounted opposite door 32 that separates the inlet chamber 94 from the dispense chamber 22. When the doors 96 and 32 are each moved to a closed position, the inlet chamber 94 is hermetically sealed. The vacuum pump 82 is fluidly connected to a block valve 98 associated with the inlet chamber 94 for providing at least partial vacuum in the inlet chamber 94 when the doors 96 and 32 are closed. The inlet chamber 94 also includes a vent valve 100 that permits venting of the inlet chamber 94 as may be required to receive chip package strips 14 through an opening provided by raising of the door 96. Operation of vacuum pump 82, door 96, block valve 98 and vent valve 100 is controlled by controller 40.

The inlet chamber 94 may include a removable top 102 that is mounted to the rest of the inlet chamber 94 through four (4) screw down clamps (not shown) to provide access into the interior of the inlet chamber 94. A viewport (not shown) may be provided in the removable top 10. The smaller size of the inlet chamber 94 relative to that of the dispense chamber 22 permits more rapid evacuation and venting of the inlet chamber 94 compared to evacuation and vent rates of the larger dispense chamber 22.

A magazine loader 104 may be located near the inlet chamber 94 for transferring unencapsulated strips 14 of chip packages to the inlet chamber 94 through an opening created by raising of door 96. The loader 104 is controlled by a controller 106 to operate in timed sequence with the multi-chamber vacuum encapsulation system 10 as described in greater detail below.

A transport mechanism 108, that may be in the form of a conveyor 110, is supported in the inlet chamber 94 for conveying chip package strips 14 from loader 104 into the inlet chamber 94. The transfer mechanism 108 is operated through servo-controlled steppers 112 that are controlled by controller 40. As best understood with reference to FIG. 3, the frame 16 is supported on its opposite side edges by a pair of spaced O-ring belts 114 that pass around the steppers 112 that serve as endstocks of the conveyor 110.

To accommodate for the gap created between the magazine loader 104 and inlet chamber 94, the transport mechanism 108 includes pinch rollers 116 that engage opposite surfaces of the frame 16 along its opposite side edges as the frame 16 passes and is grasped between the O-ring belts 114 and the pinch rollers 116. Similar pinch rollers 116 are provided on the downstream side of the inlet chamber 94 to accommodate for the gap created by door 32 between the inlet chamber 94 and the dispense chamber 22. Pinch rollers (not shown) are also provided in the dispense chamber 22 adjacent the door 32.

Further referring to FIGS. 1 and 2, an enclosed outlet chamber 118 is mounted near the outlet end 28 of dispense chamber 22, and preferably includes a construction similar to that of inlet chamber 94. The outlet chamber 118 includes a vertically movable door or partition 120 mounted opposite door 36 that separates the outlet chamber 118 from the dispense chamber 22. When the doors 36 and 120 are each moved to a closed position, the outlet chamber 118 is hermetically sealed and may be evacuated by the vacuum pump 82 that is fluidly connected to a block valve 122 associated with the outlet chamber 118 for providing at least partial vacuum in the outlet chamber 118. The outlet chamber 118 also includes an adjustable vent valve 124 controlled by controller 40 that provides a programmable vent rate of the outlet chamber 118. A suitable adjustable vent valve for use in the present invention is commercially sold by George Fisher of Tustin, Calif. The smaller size of the outlet chamber 118 relative to that of the dispense chamber 22 also permits more rapid evacuation and venting of the outlet chamber 118 compared to the evacuation and vent rates of the larger dispense chamber 22.

A magazine unloader 126 may be located near outlet chamber 118 for receiving encapsulated strips 14 of chip packages from the outlet chamber 118 through an opening created by raising of door 120. The unloader 126 is controlled by a controller 128 to operate in timed sequence with the multi-chamber vacuum encapsulation system 10 as described in greater detail below. A transport mechanism 130, preferably similar to the transport mechanism discussed above with reference to the inlet chamber 94, is supported in the outlet chamber 118 for conveying chip package strips 14 from outlet chamber 118 to unloader 126. Operation of door 120, transport mechanism 130, block valve 122 and vent valve 124 is controlled by the controller 40.

Figure 7:
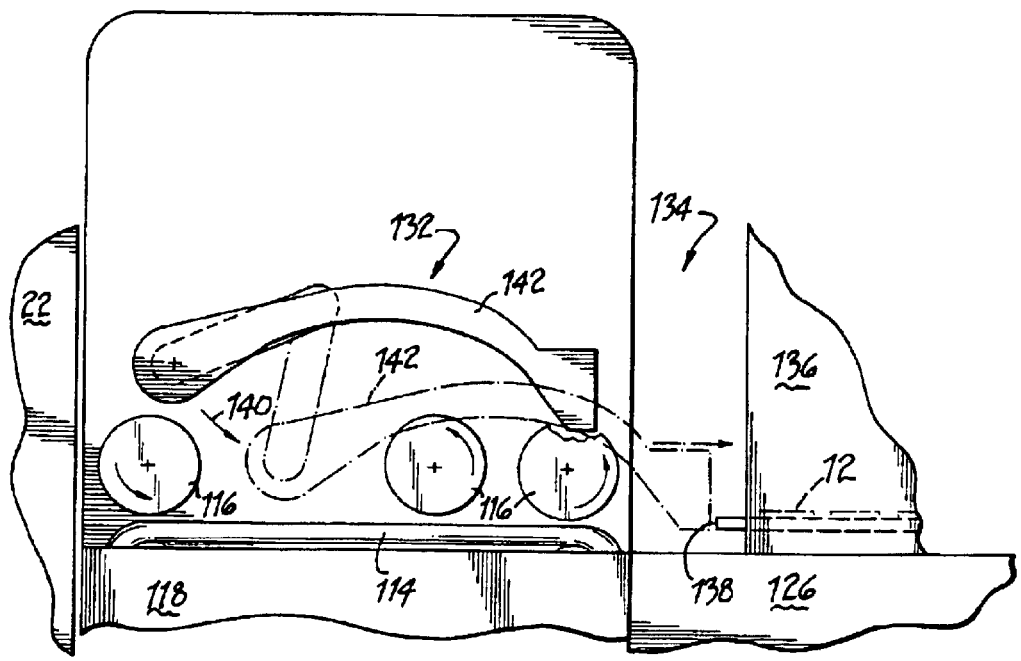
FIG. 7 is a side view of a transfer mechanism for moving a strip of encapsulated chip packages from the multi-chamber vacuum encapsulation system into a magazine.

As best understood with reference to FIG. 7, the outlet chamber 118 has a rotatable transfer mechanism 132 for pushing the chip package strip 14 across a gap 134 created by door 120 and into a magazine 136 of the unloader 126. As a rearward edge 138 of the chip package strip 14 travels from left to right in FIG. 7 and becomes free of the pinch rollers 116 and conveyor belts 114 (one shown), the transfer mechanism 132 operates to rotate in the direction of arrow 140 and push the chip package strip 14 into the magazine 136 through extended movement of a pusher arm 142 of the transfer mechanism 132.

Figure 6A:
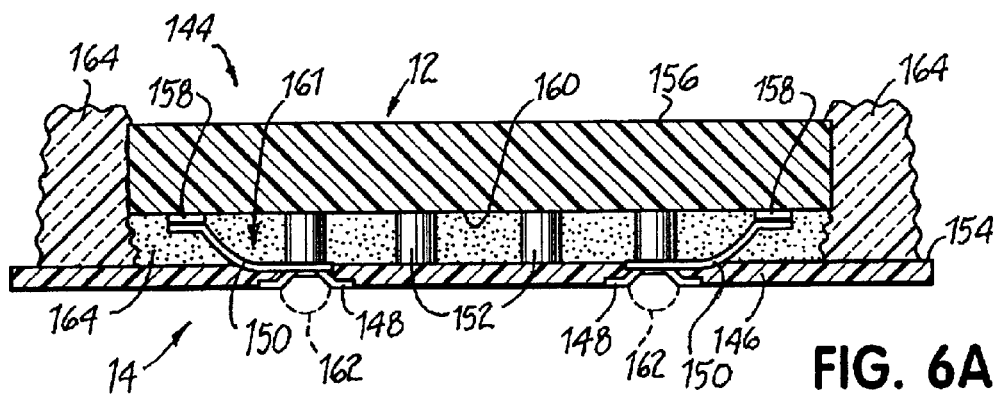
FIG. 6A is a diagrammatic cross sectional view of a semiconductor chip package at the completion of a dispense cycle.
Figure 6B:
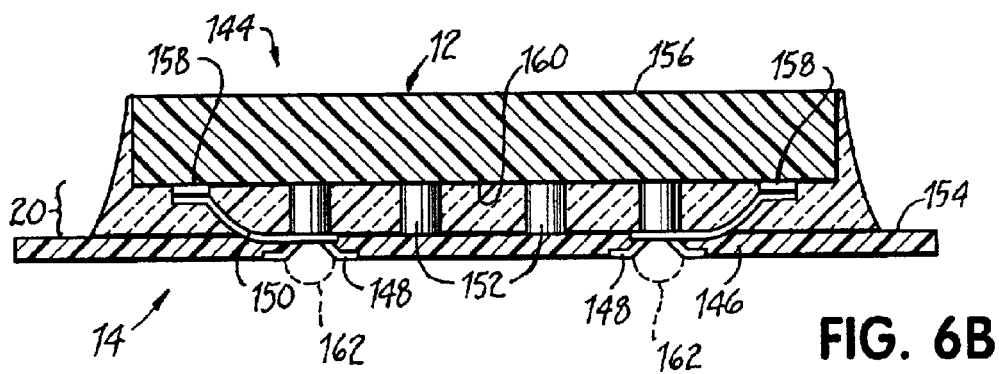
FIG. 6B is a view similar to FIG. 6A showing a semiconductor chip package at the completion of the encapsulation process.

Operation of the multi-chamber encapsulation system 10 will now be described in the encapsulation of a chip package 12, such as a $\mu$BGA chip package 144 as shown in FIGS. 6A and 6B. The μBGA chip package 144 includes a support substrate 146, such as a polyamide tape, onto which terminals 148 are formed having flexible leads 150 extending upwardly and outwardly from the terminals 148 in a fan-like arrangement. Compliant supports 152 of elastomeric material are deposited onto a surface 154 of the support substrate 146 which serve as compliant standoffs for a silicon die 156 that is mounted in contact with the flexible leads 150. The die 156 includes contacts 158 formed on a surface 160 of the die that faces the support substrate 146. The contacts 158 are in registry with and electrically coupled to the flexible leads 150. The compliant supports 152 and flexible leads 150 create a gap or void 161 between the support substrate 146 and the die 156. Solder balls 162 are electrically coupled to the terminals 148.

Before the encapsulation process commences, the doors 32, 36 and 120 are closed and the dispense chamber 22 and outlet chamber 118 are evacuated by vacuum pump 82, while the inlet chamber 94 is at atmosphere. With the door 96 of the inlet chamber 94 open, the magazine loader 104 feeds a chip package strip 14 into the inlet chamber 94. The transport mechanism 108 moves the strip 14 into the inlet chamber 94 until it engages a solenoid-operated stop pin (not shown) in the inlet chamber 94. At that time, the door 96 closes and the inlet chamber 94 is evacuated by vacuum pump 82. Sensors (not shown) are provided in the inlet chamber 94 to sense the position of the doors 32 and 96 and the vacuum level within the inlet chamber 94.

At the proper vacuum set point within inlet chamber 94, the door 32 opens and the strip 14 is transferred from transport mechanism 108 of the inlet chamber 94 to the transport mechanism 50 of the dispense chamber. Strip 14 is then conveyed into the dispense chamber 22 by the transport mechanism 50 until a forward edge of the frame 16 engages an upward lip (not shown) formed on the lift table 72. The strip 14 is lifted by the lift table 72 and clamped beneath the material dispenser 60. Door 32 is closed and, at the proper vacuum set point within the dispense chamber 22, the material dispenser 60 dispenses beads 164 of encapsulant (FIG. 6A) onto the surface 154 of support substrate 146 and about the peripheral edges 18 of each chip package 14 to form a void beneath each die 156. Sensors (not shown) are provided in the dispense chamber 22 to sense the position of the doors 32 and 36 and the level of vacuum within dispense chamber 22.

Figure 5:
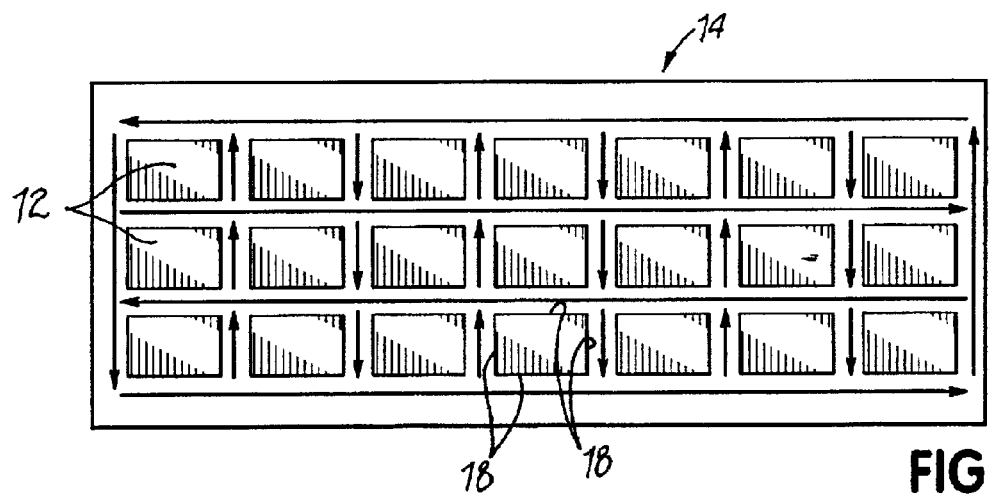
FIG. 5 is a diagrammatic top view showing a dispense pattern followed by a material dispenser in the multi-chamber vacuum encapsulation system for dispensing encapsulant material on a strip of semiconductor chip packages.

According to one dispensing pattern illustrated in FIG. 5, the material dispensing needle 64 is first moved along dispensing passes parallel to the longitudinal axis of the strip 14. The dispensing process is finished by moving the dispensing needle 64 in a series of dispensing passes perpendicular to the longitudinal axis of strip 14. When the dispensing passes are complete, each individual chip package 12 has beads 164 of encapsulant material entirely about the peripheral edges 18 of the chip package. The dispensed material may be a silicone-based encapsulating material known in the art.

After the dispense cycle, the strip 14 is lowered and transported to the dwell portion 70 of the dispense station 22 to dwell for a predetermined period of time. A solenoid-drive stop pin (not shown) is provided to stop continued movement of the strip 14. The dwell duration may be user programmable. At the dwell portion 70 of dispense chamber 22, the beads 164 of encapsulant are allowed to flow generally into the gap 161 formed between the support substrate 146 and the die 156.

After the predetermined duration of dwell, the door 36 is opened and the strip 14 is transferred from the transport mechanism 50 of the dispense chamber 22 to the transport mechanism 130 of the outlet chamber 118. The transport mechanism 130 moves the strip 14 into the evacuated outlet chamber 118 until a forward edge of frame 16 engages a solenoid-operated stop pin (not shown). The door 36 then closes and the strip 14 may be allowed to dwell in the outlet chamber 118 for a predetermined period of time, or the outlet chamber 118 may immediately commence to vent to atmosphere in a controlled manner through the adjustable vent valve 124. The total dwell time of the strip 14 in the dispense chamber 22 and the outlet chamber 118 may be divided between the two chambers in a programmable manner.

When the outlet chamber 118 is vented to atmosphere, the beads 164 of encapsulant material are forced beneath each die 156 to collapse the void 161 and form the uniform, void-free encapsulant layer 20 shown in FIG. 7B. At the appropriate pressure level in outlet chamber 118, the door 120 is opened and the strip 14 is conveyed to magazine unloader 126. Outlet chamber 118 also includes sensors (not shown) to sense the position of doors 36 and 120 and the vacuum level within the outlet chamber 118.

During the encapsulation process, the multi-chamber vacuum encapsulation system 10 may have four (4) strips 14 in various encapsulation processing stages at the same time. The inlet chamber 94 serves as a pre-dispense part queuing station while the outlet chamber 118 serves as a post-dispense dwell and vent station for the strips 14 carrying encapsulant material. In this way, the inlet, dispense and outlet chambers 94, 22 and 118, respectively, distribute the various stages of the encapsulation process across multiple chambers to increase the speed of the encapsulation process. The smaller sizes of the inlet and outlet chambers 94 and 118 relative to the size of the dispense chamber 22 permits rapid evacuation and venting of the inlet and outlet chambers while allowing the dispense chamber to remain evacuated through the entire encapsulation process to further improve throughput.

Each of the inlet, dispense and outlet chamber 94, 22 and 118, respectively, may be an independent state machine that communicates with each of the other chambers in accordance with the Surface Mount Equipment Manufacturers Association (SMEMA) standard which is incorporated herein by reference in its entirety. Since the chambers 94, 22 and 118 communicate with each other using the SMEMA communication protocol, intelligence is built into the encapsulation process performed by the multi-chamber vacuum encapsulation system 10. The system 10 monitors and stores the location and status of each strip 14 such that during a failure and reboot of the system 10, the encapsulation process can be continued where it left off without having to clear the system 10 of the strips 14.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of applicants' general inventive concept.

Having described the invention, what is claimed is:

1. Apparatus for vacuum encapsulation of a semiconductor chip package, comprising:
    a dispense chamber having an inlet end, an outlet end and a material dispenser mounted therein op able to dispense encapsulant material about peripheral edges of a semiconductor chip package under at least partial vacuum of the dispense chamber during a dispense cycle;
    an inlet chamber mounted adjacent the inlet end of said dispense chamber and isolatable therefrom in, said inlet chamber including a transport mechanism operable to transfer a semiconductor chip package to the dispense chamber under at least partial vacuum of said inlet chamber and said dispense chamber;
    an outlet chamber mounted adjacent the outlet end of said dispense chamber and isolatable therefrom, said outlet chamber including a transport mechanism operable to receive semiconductor chip package onto which encapsulant material has been dispensed from said dispense chamber under at least partial vacuum of said outlet chamber and said dispense chamber; and
    a vent connected t said outlet chamber for venting said outlet chamber to atmosphere, wherein said vent comprises an adjustable vent valve operable to control a vent rate of said outlet chamber to atmosphere, whereby upon venting said outlet chamber to atmosphere, the dispensed encapsulant material is forced into the semiconductor chip package to form an encapsulation layer therein.

2. The apparatus of claim 1 further including a movable partition mounted between the inlet end of said dispense chamber and said inlet chamber for providing a substantially air-tight seal between said dispense chamber and said inlet chamber in a closed position of said movable partition.

3. The apparatus of claim 1 further including a movable partition mounted between the outlet end of said dispense chamber and said outlet chamber for providing a substantially air-tight seal between said dispense chamber and said outlet chamber in a closed position of said movable partition.

4. The apparatus of claim 1 wherein said dispense chamber includes a transport mechanism operable to receive a semiconductor chip package from said inlet chamber, move the semiconductor chip package through said dispense chamber, and transfer the semiconductor chip package to said outlet chamber.

5. The apparatus of claim 4 further including at least one controller for controlling independent operation of each of said transport mechanisms in said inlet, outlet and dispense chambers.

6. The apparatus of claim 1 further including a single vacuum pump fluidly connected to each of said inlet, outlet and dispense chambers to provide at least partial vacuum in each of said chambers.

7. The apparatus of claim 1 wherein said dispense chamber includes a dispense portion at which location said material dispenser is operable to dispense encapsulant material about peripheral edges of a semiconductor chip package, and a dwell portion at which location the semiconductor chip package onto which encapsulant material has been dispensed is permitted to dwell to allow the encapsulant material to generally flow into the semiconductor chip package.

8. Apparatus for vacuum encapsulation of a semiconductor chip package, comprising:
    a dispense chamber having an inlet end, an outlet end and a material dispenser mounted therein operable to dispense encapsulant material about peripheral edges of a semiconductor chip package during a dispense cycle;
    an inlet chamber mounted adjacent the inlet end of said dispense chamber and isolatable therefrom, said inlet chamber including a transport mechanism operable to transfer a semiconductor chip package to said dispense chamber;
    an outlet chamber mounted adjacent the outlet end of said dispense chamber and isolatable therefrom, said outlet chamber including a transport mechanism operable to receive semiconductor chip package onto which encapsulant material has been dispensed from said dispense chamber;
    a single vacuum pump fluidly connected to each of said inlet, outlet and dispense chambers for evacuating each of said chambers in a controlled manner, whereby said dispense station is evacuated, said inlet chamber is evacuated prior to the transfer of a semiconductor chip package to said dispense chamber, and said outlet chamber is evacuated prior to the receipt of a semiconductor chip package onto which encapsulant material has been dispensed from said dispense chamber; and
    a vent connected to said outlet chamber for venting said outlet chamber to atmosphere, whereby upon venting said outlet chamber to atmosphere, the dispensed encapsulant material is forced into the semiconductor chip package to form an encapsulation layer therein.

9. The apparatus of claim 8 wherein said dispense chamber includes a dispense portion at which location said material dispenser is operable to dispense encapsulant material about peripheral edges of a semiconductor chip package, and a dwell portion at which location the semiconductor chip package onto which encapsulant material has been dispensed is permitted to dwell to allow the encapsulant material to generally flow into the semiconductor chip package.

10. The apparatus of claim 9 wherein said vent comprises an adjustable vent valve operable to control a vent rate of said outlet chamber to atmosphere.

* * * * *

UNITED STATES PATENT AND TRADEMARK OFFICE
CERTIFICATE OF CORRECTION

PATENT NO. : 6,769,893 B2
DATED : August 3, 2004
INVENTOR(S) : Eric Austin et al.

It is certified that error appears in the above-identified patent and that said Letters Patent is hereby corrected as shown below:

Column 9,
Line 5, change "op able" to -- operable --.
Line 11, delete "in".
Line 19, insert -- a -- after "receive".
Line 23, change "t" to -- to --.
Line 24, insert -- a -- after "receive".

Signed and Sealed this

Tenth Day of May, 2005

JON W. DUDAS
*Director of the United States Patent and Trademark Office*